United States Patent
Lal et al.

(10) Patent No.: US 6,433,463 B1
(45) Date of Patent: Aug. 13, 2002

(54) METHOD AND APPARATUS FOR STRESS PULSED RELEASE AND ACTUATION OF MICROMECHANICAL STRUCTURES

(75) Inventors: Amit Lal; Ville Kaajakari, both of Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 0 days.

(21) Appl. No.: 09/585,314

(22) Filed: Jun. 1, 2000

Related U.S. Application Data

(60) Provisional application No. 60/137,652, filed on Jun. 4, 1999.

(51) Int. Cl.⁷ .............................................. H01L 41/08
(52) U.S. Cl. .............. 310/328; 310/323.08; 310/323.06
(58) Field of Search ........................... 310/328, 323.06, 310/323.03, 323.04, 323.05

(56) References Cited

U.S. PATENT DOCUMENTS

| | | | |
|---|---|---|---|
| 5,006,749 A | | 4/1991 | White .................... 310/323.03 |
| 5,610,468 A | * | 3/1997 | Miyazawa et al. ........... 310/323 |
| 5,619,089 A | | 4/1997 | Suzuki et al. .......... 310/323.06 |
| 5,735,026 A | | 4/1998 | Min ........................... 29/25.35 |
| 5,766,369 A | | 6/1998 | Tran et al. .................... 134/1.3 |
| 5,940,947 A | * | 8/1999 | Takeuchi et al. ........... 29/25.35 |

FOREIGN PATENT DOCUMENTS

| | | | |
|---|---|---|---|
| JP | 07027999 | | 1/1995 |
| JP | 11-221493 | * | 8/1999 |

OTHER PUBLICATIONS

Analysis of Part Motion on a Longitudinally Vibrating Plate; Reznik, Canny, Goldberg; 8/97; University of California at Berkley.*

"Stiction Release," Research Disclosure, GB, Industrial Opportunities Ltd., Havant, No. 299, Mar. 1, 1989, XP000049572, ISSN:0374–4353.

Hsi–Jin J. Yeh, et al., "Fluidic Self–Assembly of Microstructures and its Application to the Integration of GaAs on Si," IEEE International Workshop on MEMS, Oiso, Japan, 1994, pp. 279–284.

Bishnu P. Gogoi, et al., "Adhesion Release and Yield Enhancement of Microstructures Using Pulsed Lorentz Forces," J. of MicroMechanical Systems, vol. 4, No. 4, Dec. 1995, pp. 185–192.

Roya Maboudian et al., "Stiction Reduction Processes for Surface Micromachines," Tribology Letters, vol. 3, Jun. 1997, pp. 215–221.

(List continued on next page.)

*Primary Examiner*—Brian Sircus
*Assistant Examiner*—Michael C. Zarroli
(74) *Attorney, Agent, or Firm*—Foley & Lardner

(57) ABSTRACT

Micromechanical parts are freed from a surface of a substrate to which the parts are stiction bonded by applying a pulse stress wave to the substrate that propagates through the substrate and is reflected at the surface to which the micropart is stiction bonded, breaking the bond between the micropart and the substrate surface by a spalling action at the surface. A piezoelectric transducer may be secured to the bottom surface of the substrate such that a voltage pulse supplied to the piezoelectric transducer deforms the piezoelectric element and the substrate to which it is secured to provide a pulse stress wave that propagates through the substrate to the top surface. For microparts that are in contact with but not stiction bonded to the substrate top surface, a pulse stress wave can be applied to the substrate to drive the microparts away from the surface by the rapid displacement of that surface as the pulse stress wave is reflected at the surface. Microparts that are attached to the surface in a way to permit rotation or a translation of movement may be activated by applying a pulse stress wave to the substrate to drive such parts away from contact with the surface into their erected positions.

28 Claims, 9 Drawing Sheets

OTHER PUBLICATIONS

C.H. Mastrangelo, "Adhesion–Related Failure Mechanisms in Micromechanical Devices," Tribology Letters, vol. 3, Jun. 1997, pp. 223–238.

Steven A. Henck, "Lubrication of Digital Micromirror Devices," Tribology Letters, vol. 3, Jun. 1997, pp. 239–247.

Li Fan, et al., "Self–Assembled Microactuated XYZ Stages for Optical Scanning and Alignment," Transducers '97, Jun. 1997, pp. 319–322.

Gregory T.A. Kovacs, Micromachined Transducers Source Book (book), 1999, pp. 205–207.

Karl–Friedrich Bohringer, et al., "Parallel Microassembly with Electrostatic Force Fields," Proceedings of the 1998 IEEE Int. Conf. on Robotics & Automation, Leuven, Belgium, May 1998, pp. 1204–1211.

Ville Kaajakari, et al., "Ultrasonically Driven Surface Micromachined Motor," MEMS 2000, Miyazaki, Japan, Jan. 23, 2000.

* cited by examiner

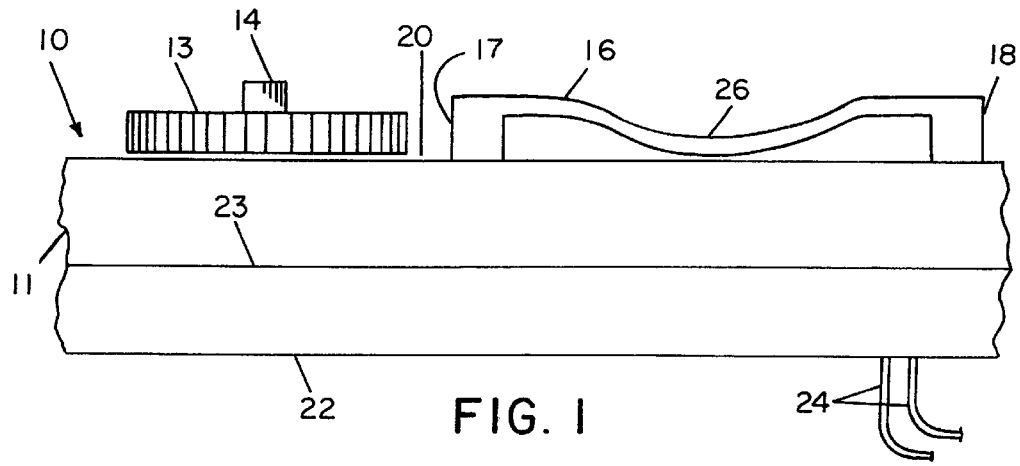
FIG. 1
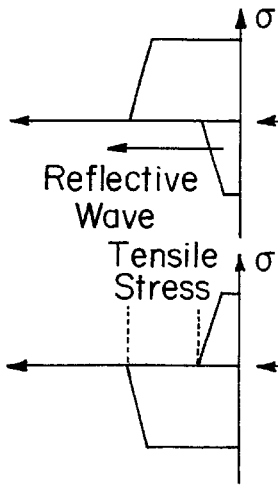 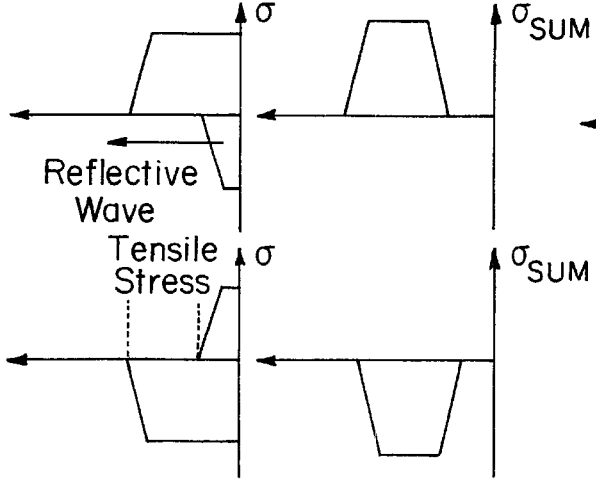 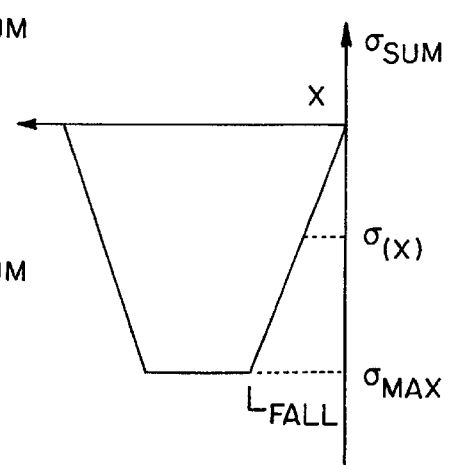
FIG. 2   FIG. 3

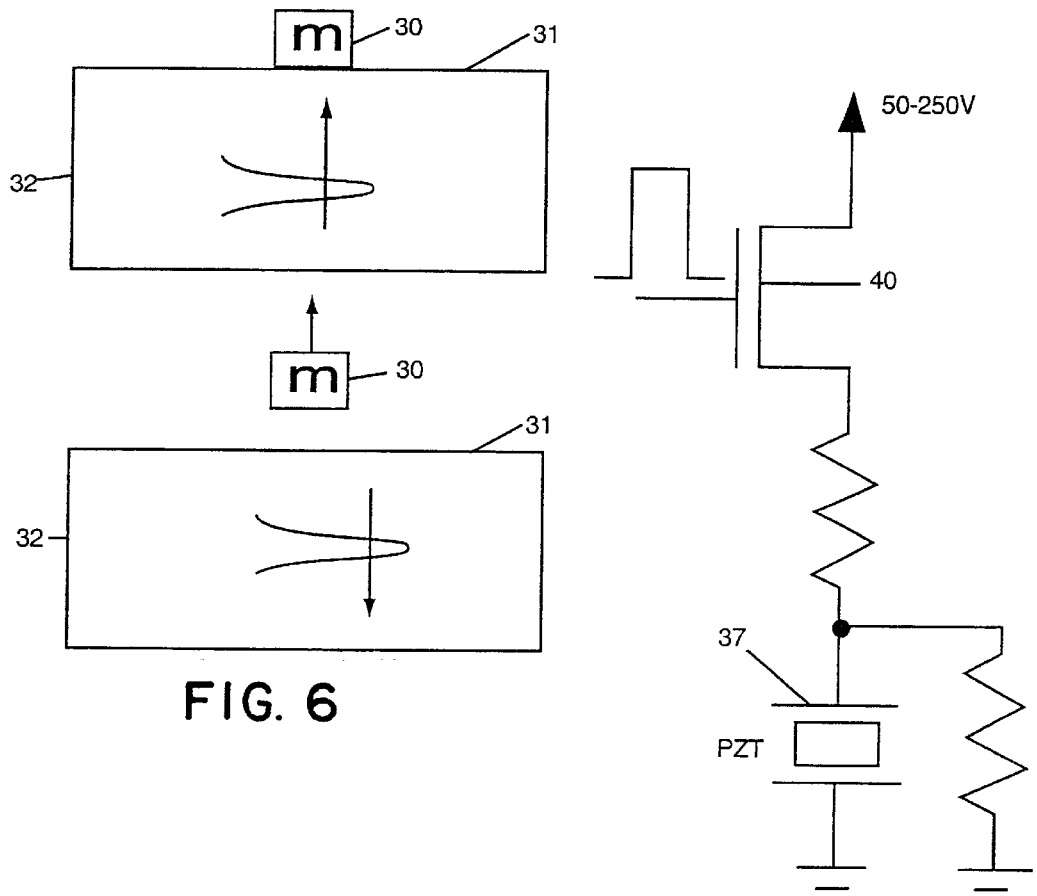
FIG. 6
FIG. 8
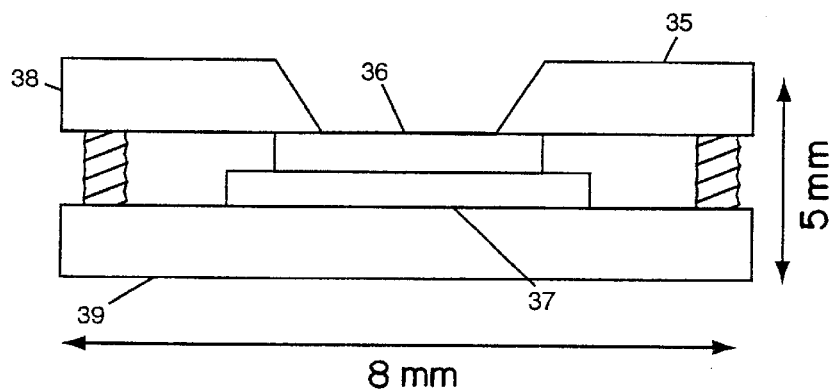
FIG. 7 ns of a substrate may be freed in an efficient and economical manner.

METHOD AND APPARATUS FOR STRESS PULSED RELEASE AND ACTUATION OF MICROMECHANICAL STRUCTURES

This application claims the benefit of provisional application Ser. No. 60/137,652, filed Jun. 4, 1999, which is incorporated herein by reference.

FIELD OF THE INVENTION

This invention pertains generally to the field of micromachined parts and actuators and to the assembly of micromachines.

BACKGROUND OF THE INVENTION

Various stiction phenomena cause major problems in micromachined devices because of the large surface to volume ratio of micromachined parts. As such parts are released from the underlying substrate, liquid forces can pull the devices to the surface of the substrate, where they may be permanently stuck. Several methods for releasing such microstructures or preventing bonding to the substrate in the first place have been developed, including dry release and the use of self-assembled monolayers. See, e.g., R. Maboudian, et al., "Stiction Reduction Processes for Surface Micromachines," Tribology Letters, Vol. 3, 1997, pp. 215–221.

In addition to the stiction or surface bonding of parts that occurs during forming of the micromachined parts, an additional significant problem is in-use stiction, wherein previously released microparts become stuck to the substrate or other parts. For example, high voltages are often required for speed and sensitivity in micromachined devices, and such voltages can pull the previously released part to the surface where it then becomes stuck. Various methods have been developed to overcome this sticking or bonding problem during use, including providing the part with self-assembled monolayers and Lorentz force approaches. The Lorentz force has been used to release stuck parts, but this method requires an external magnetic field. See, B. Gogoi, et al., "Adhesion Release and Yield Enhancement of Microstructures Using Pulsed Lorentz Forces," JMEMS, Vol. 4, 1995, pp. 185–192. While the use of surface assembled monolayers can reduce the stiction problem that is encountered during use of the microparts, such monolayers on the parts can degrade the device performance. In addition, the monolayers wear out over time. Thus, the re-release of stuck micromachined parts during use continues to be a major concern for micromachined devices.

The assembly of large arrays of surface micromachined parts is another challenge in the commercialization of microelectrical-mechanical systems (MEMS) technology. Series assembly or erection of parts is too slow and costly. On-chip robots have been used, but consume valuable surface area. See, L. S. Fan, et al., "Self-Assembled Microactuated XYZ Stages for Optical Scanning and Alignment," Transducers 1997, Chicago, Ill., 1997. Ultrasonic vibration has been used to overcome friction and to shake parts around for assembly. M. Cohn, et al., "Parallel Microassembly with Electrostatic Force Field," Proc. IEEE International Conf. on Robotics and Automation, Vol. 2, 1998, pp. 1204–1211. Liquid forces have been used for assembling GaAs lasers on silicon dies. H. J. Yeh, et al., "Fluidic Self Assembly of Microstructures and its Application to the Integration of GaAs on Si," IEEE International Workshop on MEMS, Oiso, Japan, 1994, pp. 279–284. However, the ultrasonic vibration and liquid assembly approaches offer little directional control. In addition, the use of liquid forces may not be suitable for surface micromachined parts due to the effects of surface tension and stiction.

SUMMARY OF THE INVENTION

In accordance with the invention, microparts can be freed from a surface of a substrate to which the micropart is stiction bonded in an efficient and economical manner. Microparts can be freed from their underlying substrates to overcome stiction bonding forces incurred during production of the devices, as well as to free microparts that have become incidentally bonded to the underlying substrate after initial freeing of the part from the substrate. It is a particular advantage of the present invention that it can be carried out after the micromachined devices are fully formed, assembled, and packaged, at any time during the useful life of the devices.

In carrying out the invention, microparts, such as gears, beams, sliding actuators, etc., are formed on or assembled on the top surface of the substrate that is typically but not necessarily single crystal silicon. A transducer is secured to the substrate, preferably at the bottom surface of the substrate which is opposite to the top surface with which the microparts are in contact. A preferred transducer is a piezoelectric transducer which can be secured to the bottom surface of the substrate in various ways, such as by adhesive, mechanical pressure contact, or by being integrally formed with the substrate. To free the microparts from the surface to which they are stiction bonded, a voltage pulse is applied to the piezoelectric transducer which deforms in response thereto to apply a pulse stress wave to the substrate. The pulse stress wave propagates through the substrate and is reflected at the surface to which the micropart is stiction bonded. The reflection of the pulse stress wave at the top surface causes a rapid up and down displacement of that surface and a spalling action at the surface which breaks the bond between the micropart and the substrate surface. The substrate may comprise, for example, a semiconductor wafer such as single crystal silicon, on which electronic components may also be formed.

Further, in accordance with the invention, microparts that are in contact with but not bonded to a substrate surface may be displaced from that surface by applying a pulse stress wave to the substrate. The pulse stress wave propagates through the substrate to the top surface, where it is reflected with a rapid displacement of the top surface toward and then away from the micropart to transfer energy from the reflected pulse stress wave to the micropart, thereby to displace the micropart away from the surface by the impact energy transferred from the reflected stress wave. Microparts may be displaced from a first position, in which they are in contact with the surface, to a second stable position in which they are displaced from the surface. In particular, micropart panels may be connected by a hinge secured to the top surface of the substrate such that the impact to the panel from the displacement of the top surface causes the panel to rotate about the hinge from a first position resting against the top surface to a second position in which the panel is partially or fully upright and in which it is held stable. The panel may be formed with one or both of its surfaces reflective so that it will reflect a beam of light when it is in its upright position, and pass the beam of light when it is in its first position in contact with the surface. An array of such panels connected by hinges to the top surface may be provided and may be selectively maintained in their first or second positions to provide a desired steering of a light beam through the array. Other micropart components which require displacement from the surface to transfer the microparts to their erected positions can be so displaced utilizing the present invention.

Further objects, features and advantages of the invention will be apparent from the following detailed description when taken in conjunction with the accompanying drawings.

BRIEF DESCRIPTION OF THE DRAWINGS

In the drawings:

FIG. 1 is an illustrative side view of a substrate carrying microparts on its top surface which may be freed from or displaced from the top surface in accordance with the invention.

FIG. 2 are views illustrating the reflection of the stress wave at the top surface of the substrate.

FIG. 3 is an illustrative view of the stress wave after it has been fully reflected from the top surface.

FIG. 6 is a simplified diagram illustrating momentum transfer from the top surface of the substrate to a micropart in contact with the top surface as the stress wave is reflected at the top surface.

FIG. 7 is a simplified diagram of a packaging jig for mounting a PZT piezoelectric transducer plate to a silicon die.

FIG. 8 is a schematic circuit diagram of a drive circuit for the PZT piezoelectric transducer.

DETAILED DESCRIPTION OF THE INVENTION

Figure 4:
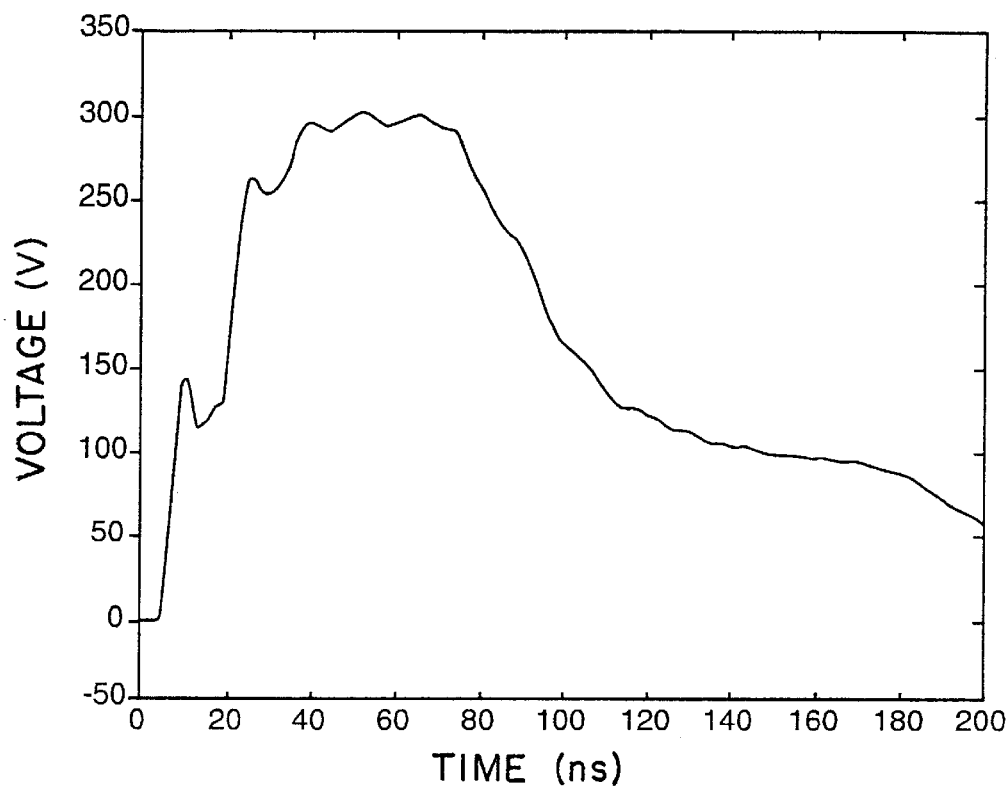
FIG. 4 is a graph showing the measured voltage pulse supplied to a PZT piezoelectric transducer secured to a substrate to apply a pulse stress wave thereto.

For purposes of illustrating the invention, an exemplary micromachined structure is shown generally at 10 in FIG. 1. The micromachined structure 10 includes a substrate 11 and illustrative microparts including a gear 13 mounted to a hub 14 and a beam 16 which is mounted at its ends by posts 17 and 18 to the top surface 20 of the substrate 11. Microparts as used herein refers to microelectrical-mechanical parts of a relatively small size that are not typically produced by conventional machining techniques but rather by surface micromachining techniques analogous to those used in semiconductor manufacturing. Such parts generally have maximum dimensions of a few millimeters and often less than one millimeter. The upper limit of size is imposed where parts become larger than the actuating substrate. The materials of such micromachined structures generally also are similar to those encountered in semiconductor manufacturing. For example, the substrate 11 may comprise a (doped, undoped, or partially doped) single crystal silicon wafer, and the microparts which are illustrated by the gear 13 and beam 16 are typically also formed of single crystal silicon or polysilicon, although such parts may also be formed of other materials, including metals, which are then assembled onto the substrate. It is understood that the substrate 11 is not limited to a single crystal silicon, but may comprise any material suitable to the application for the micromechanical structure, including other semiconductors, glass, ceramics, metal, plastics, etc. Further, a piezoelectric transducer 22 is secured to the bottom surface 23 of the substrate 11 and has electrical supply leads 24 by which electrical power may be supplied to the piezoelectric transducer 22.

The gear 13 and beam 16 are illustrative of the many micromechanical parts that may be formed in place or mounted onto a substrate for carrying out various functions. Examples of other types of microparts include cantilevers, linear actuator plungers, springs, levers, mirrors, lenses, capacitive and magnetic motors, etc. The dimensions of such microparts are typically small, generally less than a few millimeters and often less than a millimeter, and the surface area of the micropart that may be in contact with the substrate surface in relation to the total volume of the micropart is quite large. Consequently, surface phenomena cause what will be referred to as stiction bonding between the micropart and the substrate's top surface. Such stiction bonding is very often encountered during the initial formation of microparts in place upon the substrate, such as by liquid-based micromachining processes, but it is also encountered during the normal usage of such microstructures even though the microparts have previously been freed from the substrate. The effect of surface to surface stiction bonding is illustrated in FIG. 1 by the bending of the beam at its center 26 into contact with the top surface 20, where it is held by such stiction bonding. The sticking of the beam to the top surface obviously interferes with the intended function of the beam, which may, for example, be used as a vibrating beam, force transducer, sound transducer, accelerometer, etc. Similarly, if the gear 13 becomes stiction bonded to the underlying substrate surface, it cannot rotate.

In accordance with the present invention, microparts are freed from the surface of the substrate to which they may be bonded by applying a stress pulse wave to the substrate 11 that propagates through the bulk of the substrate, preferably from the bottom surface to the top surface 20 as a compressive stress wave, and is then reflected at the top surface 20. The reflection of the stress wave at the top surface 20 causes the top surface to displace rapidly up and then back down again. Although this displacement is very slight, it is very rapid and forceful, sufficient to break the stiction bond between the top surface and the microparts in most cases. A preferred manner of applying the stress pulse wave to the substrate 20 is the utilization of the piezoelectric transducer 22 which is secured to the bottom surface 23 by, for example, an adhesive layer at the interface 27 between the transducer 22 and the bottom surface 23. When a voltage pulse is applied by the leads 24 to the transducer 22, its deformation in response to the pulse will be transmitted to the substrate 11 as a compressive stress wave that propagates transversely through the substrate to the top surface 20.

Furthermore, in accordance with the invention, after the microparts have been formed and the micromachined structure has been packaged for use, the incidental stiction bonds that may occur between the microparts and the substrate from time to time may be broken by applying a pulse voltage to the transducer 22 to provide a compressive stress wave that will propagate through the substrate and deflect the top surface to break the stiction bonding as the pulse stress wave is reflected at the top surface. Because the piezoelectric transducer 22 is secured to the substrate 11 and the leads 24 may be extended outside the package in which the device is encapsulated, the reconditioning of the micromachined parts to break any bonds that may have been formed may be carried out without requiring that the device package be opened and with the simple expedient of applying the voltage pulse to the leads 24.

The breaking of the stiction bonds is believed to be a consequence of spalling taking place at the surface. Spalling can occur when an initially compressive pulse stress wave is reflected at a free surface of a substrate. Since there cannot be any stress at the free surface, the compressive wave is reflected, producing a tensile wave that cancels the compressive wave at the surface, as shown in FIG 2. The sum of the reflected and incident waves produces a tensile stress beneath the surface. This stress reversal has been used in characterizing pulses by attaching small pellets at the end of rods with a grease interface. See K. Graf, "Wave Motion in Elastic Solids," New York: Dover Publications, 1991. The compressive pulse propagates through grease and is reflected at the free surface of the pellet. Since the grease cannot sustain the tensile stress, the pellet flies off due to the incident wave momentum. Spalling has also been considered for mining purposes. See, e.g., Norman Davids, "International Symposium on Stress Wave Propagation in Materials," New York: Interscience Publishers, 1960.

As illustrated in FIG. 1, the stress wave may be generated by using a piezoelectric transducer 22, such as a lead zirconate titanate (PZT) plate, secured to the back or bottom surface of the substrate (e.g., a semiconductor wafer) on which the microparts are supported. To obtain significant tensile stress beneath the surface, the pulse fall time has to be small and the incident stress magnitude has to be large. To optimize the generated pulse, an analytical derivation of the tensile stress magnitude beneath the surface may be carried out as set forth below.

The maximum stress we can generate is given by $$\sigma_{MAX} = d_{33} Y \frac{V}{T_{PZT}} \tag{1}$$

where $d_{33}$ is the piezoelectric constant, Y is Young's modulus, V is the voltage at the PZT electrodes, and $T_{PZT}$ is the thickness of the PZT. The fall time $t_{FALL}$ is determined by the PZT capacitance C and the discharge current I which might be constant (a current source drives) or variable (a voltage source drives):

$$t_{FALL} = \frac{CV}{I} = \frac{\varepsilon_{PZT} A}{T_{PZT}} \frac{V}{I} \tag{2}$$

Here $\varepsilon_{PZT}$ is the permitivity and A is the area of the PZT. Since the distance $L_{FALL}$ in FIG. 3 is related to time by $L_{FALL} = c_{Si} t_{FALL}$, where $c_{Si}$ is the silicon speed of sound, we can express the stress at point x as $$\sigma(x) = \sigma_{MAX} \frac{x}{c_{Si} t_{FALL}} \tag{3}$$

Substituting equations (1) and (2) into equation (3) we get $$\sigma(x) = \frac{d_{33} YI}{c_{Si} \varepsilon_{PZT} A} x \tag{4}$$

It is interesting to note that the stress does not depend on the thickness of the PZT but on the maximum current drive of the circuit in the case of constant current source drive. For optimum performance the PZT should have a large piezoelectric coefficient and low permitivity.

Figure 5:
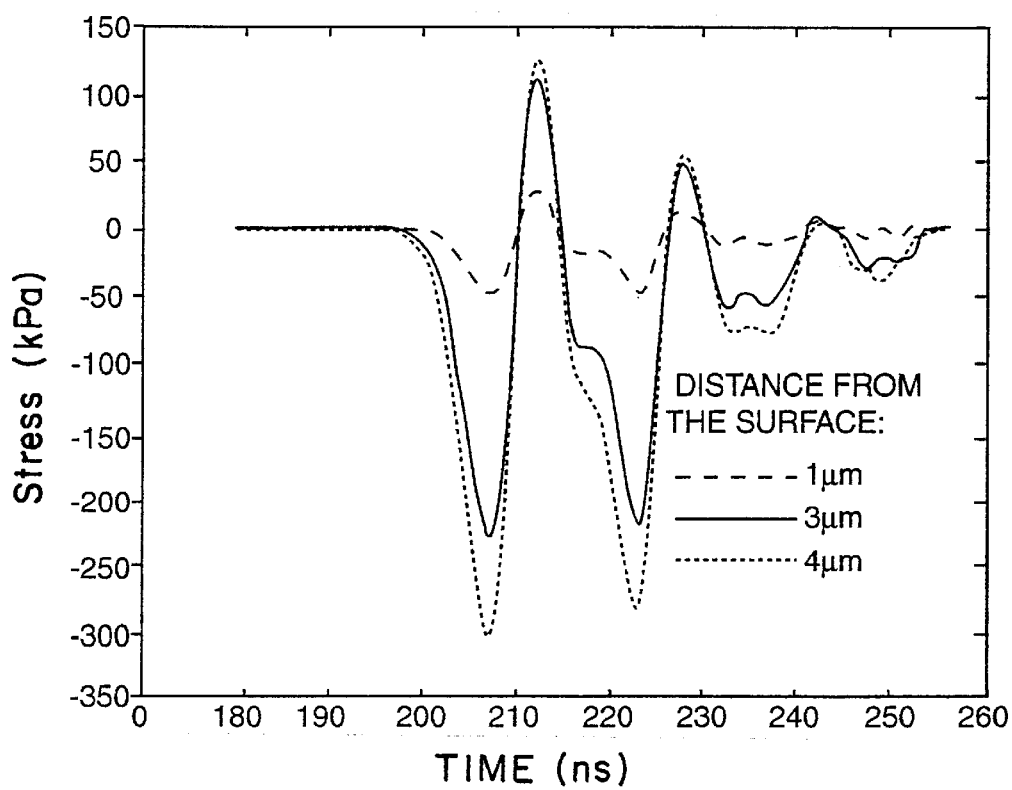
FIG. 5 is a graph obtained by finite element time-domain simulation of the stress characteristics of a substrate showing the stress wave in response to actuation by a piezoelectric transducer responding to the voltage pulse of FIG. 4.

To show plausibility of spalling using the PZT transducer 22 secured to the substrate, finite-element time-domain simulations were carried out using commercial software (PZFlex, Weidlinger Associates, Inc.) that is designed to model ultrasonic and piezoelectric effects. The actual measured voltage pulse generated at the PZT electrodes was used for the simulations. FIG. 4 shows a typical measured voltage pulse and FIG. 5 shows the simulated stress response in the substrate. The parasitic capacitances and inductances in addition to PZT self resonances may cause the fine features seen in the voltage pulse in FIG. 4. Even with relatively long rise and fall times for the voltage pulse, stress levels of several kilopascals were achieved beneath the substrate surface as illustrated in FIG. 5. The data also indicate that thicker micromachined parts should be easier to release by spalling.

In the previous discussion it was assumed that the micromachined parts were attached to the surface and the wave propagated into them. However, if the part is released and only in contact with the surface, it moves with the surface as long as the surface acceleration is positive. When the surface velocity has reached its maximum and the surface starts slowing down and retreating, the released part maintains maximum velocity and is, in effect ejected, as illustrated in FIG. 6 in which the micropart 30 initially in contact with the surface 31 of a substrate 32 to have impact energy transferred thereto leaves the surface as the stress wave is reflected.

However, the micropart quickly slows down due to air resistance. Solving Newton's equation $$ma = -F_{DRAG} \quad (5)$$

we can get the approximate distance the part moves into air. If the Reynolds number is small (<2000) the drag force in equation (5) is given by $$F_{DRAG} = Bv \quad (6)$$

where B is a constant and v is the part velocity. For spheres the constant B is $$B = 12D\mu \quad (7)$$

where D is the diameter and $\mu$ is the viscosity of air. Finite element simulations gave a peak surface velocity of 0.3 m/s. The resulting distance traveled by an object with a diameter of 10 $\mu$m, initial velocity 0.3 m/s, and density 2030 kg/m³ is then $$s = \frac{v_0 m}{B} \approx 100 \text{ }\mu m \quad (8)$$

In this calculation, we have neglected the gravity force since it is two orders of magnitude smaller than the initial drag force.

The initial direction of the part motion is upwards, causing vertical displacement of parts. However, it is also possible to get sideways motion by creating stress pulses with spatial amplitude gradients.

To demonstrate the release of stiction bonded micromachined structures, polysilicon beams were fabricated on a silicon substrate. The beams were 0.9 $\mu$m thick, 15 $\mu$m wide, and 10 to 150 $\mu$m long, and spaced from the substrate, as deposited, on a 1.3 $\mu$m oxide layer. No dimples were used on the beams. The polysilicon was deposited at 580° C. followed by 3 hour anneal at 600° C. A 100 Å layer of gold was evaporated on the beams to minimize the electrostatic stiction effects. The substrate was then mounted on a PZT plate (4 mm×4 mm×0.5 mm, Stavely Sensors, Inc., Connecticut) by. two different methods: adhesive bonding and by using a special packaging jig. For adhesive bonding cyanoacrylate was used. The bond thickness was 2–10 $\mu$m as measured under a microscope. A schematic of the packaging jig 35 is shown in FIG. 7 holding the substrate 36 and PZT plate 37 tightly between metal plates 38 and 39. A drive circuit was used as shown in FIG. 8 comprised of a MOSFET 40 connected in series with the PZT 37 between a high voltage supply (50–250 v) and ground. The jig has an advantage over the adhesive bonding because the silicon/PZT sandwich can be precompressed for better coupling.

A first step was to release the beams and dry them in a critical point dryer. To simulate in-use stiction bonding (discussed in Steven Henck, "Lubrication of Digital Micromirror Devices," Tribology Letters, Vol. 3, pp. 239–247, 1997) the beams were pushed into contact with the surface of the substrate, where they remained stuck. The beams could be repeatedly forced to stick and unstick by using a probe tip, proving that the stiction was not electrostatic.

To test the spalling mechanism, the stuck beams were released by applying voltage pulses on the PZT 37. The pulse amplitude was varied from 50 volts and increased to as high as 250 volts. The release threshold seemed not to be dependent on the number of pulses applied—it was only dependent on voltage which determines the magnitude of the stress pulse. The experiment was repeated for 8 samples with similar results. In each case, all beams were successfully unstuck.

Next, wet adhesion was simulated by immersing samples in ispropanol. As the samples dried, the capillary forces pulled the beams to the surface. Beams which got stuck in the wet process were successfully released by stress wave pulsing in the manner discussed above.

Figure 9:
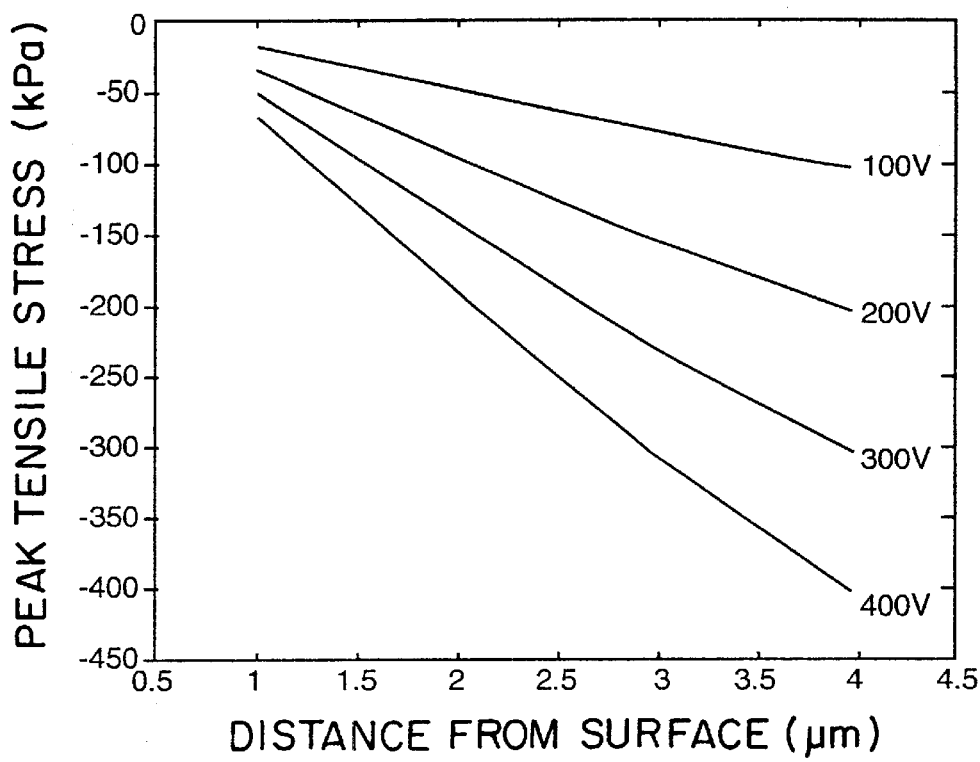
FIG. 9 graph showing calculated maximum tensile stress for different pulse amplitudes applied by the piezoelectric transducer.

The release voltage was found not to depend on the beam length. This indicates that the release was due to spalling, since this effect is not dependent on the shape or area of the stiction bonded structure. It is possible to get an estimate of the bonding force by correlating the pulse voltage to the maximum simulated stress level in PZFlex, as shown in FIG. 9.

The present invention also encompasses bulk actuation by stress wave pulsing. To demonstrate this feature, the jig 35 described above was used for optimum coupling. The PZT was pulsed using voltages between 100 and 400 V. The first procedure was carried out in atmospheric pressure. Released parts were observed moving on the silicon surface. In this procedure, there was no control over the direction that the parts would travel. However, parts may be moved in desired directions by applying stress pulses with an amplitude gradient and/or adding some constraints.

Figure 10:
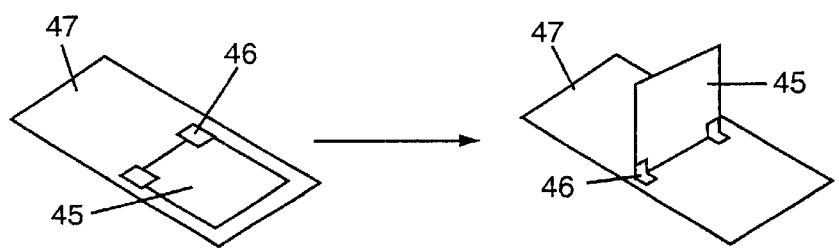
FIG. 10 are illustrations of a micromachined flap or panel being raised by a pulse stress wave in accordance with the invention.

In the previous experiment, the motion was mainly in spatial directions due to drag force. To reduce this force, procedures were done in a vacuum. Doing so allowed hinged structures to be moved to an upright position as shown in FIG. 10. The parts 45 stayed in the vertical position indefinitely. Flat panels 45 of polysilicon were connected to rotate about hinges 46 which were secured to the substrate surface 47.

Figure 11:
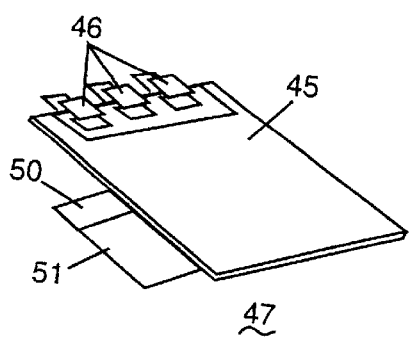
FIG. 11 is a simplified view of a panel connected by a hinge secured to the top surface of a substrate and having an underlying electrostatic pull down electrode.
Figure 12:
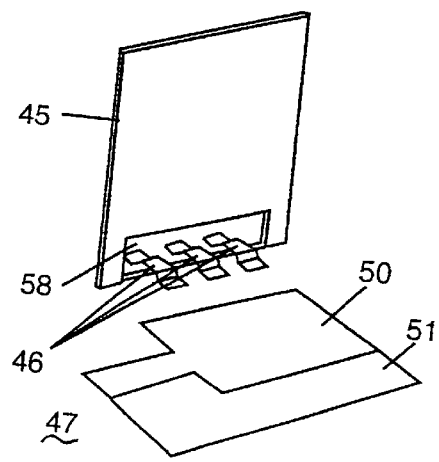
FIG. 12 is a diagram of the panel connected by a hinge to the substrate, as in FIG. 11, showing the panel raised to its upright position.
Figure 13:
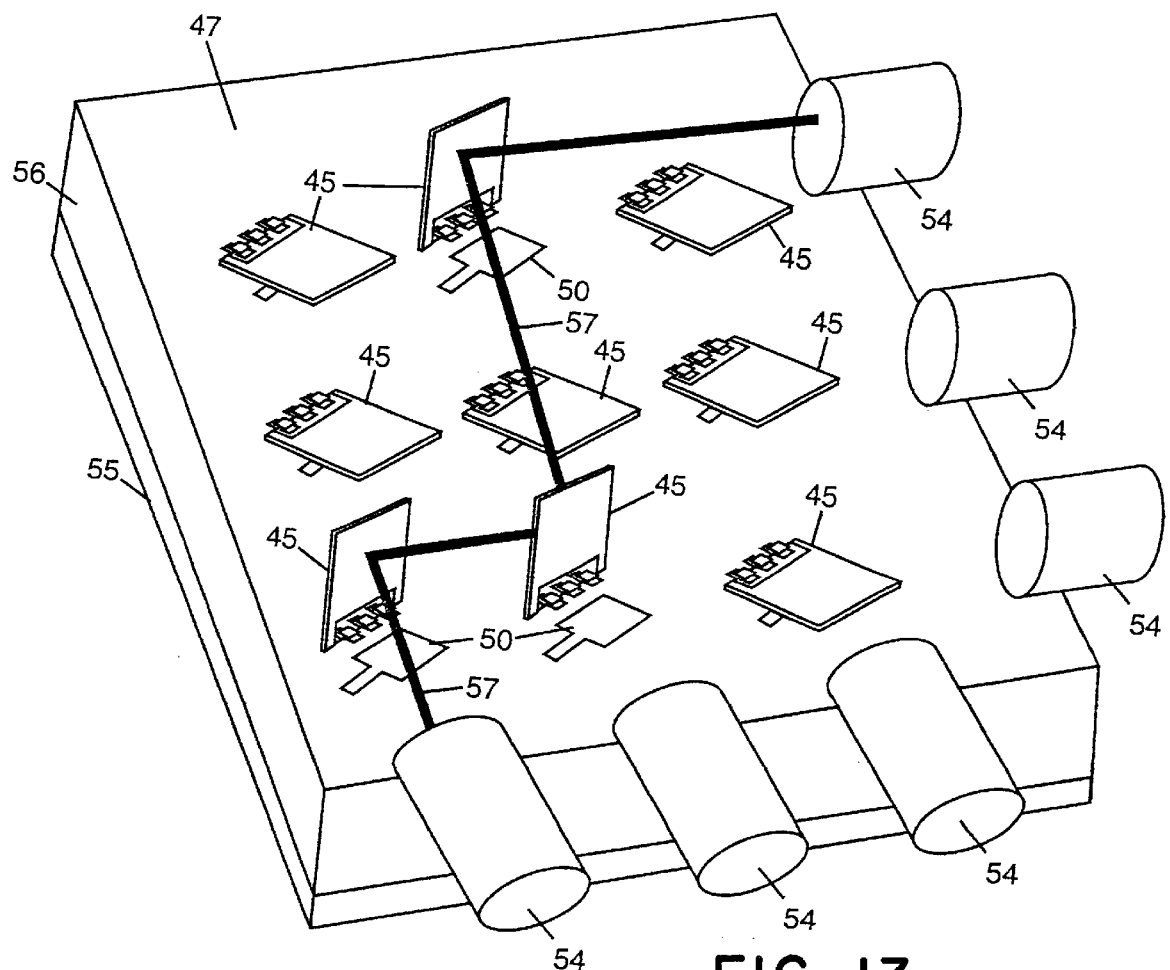
FIG. 13 is a simplified diagram of an array of panels mounted by hinges to a substrate in positions to be selectively actuated to deflect light beams to form an optical switching network.

The panels 45 may be selectively erected or retained in their folded position in contact with the surface by utilizing appropriate structures on the substrate under the panels. An example of such structures is shown in FIGS. 11 and 12, comprising an electrostatic pull down electrode 50 formed in conjunction with CMOS circuitry 51 on the surface 47 of the substrate. When electrical voltage is applied to the electrode 50, the electrostatic forces between the electrode and the panel 45 will hold the panel in its down position (as shown in FIG. 11) when the stress pulse is reflected at the surface 47, whereas when the electrode 50 is not provided with a voltage and applies no electrostatic force to the panel, the stress pulse will drive the panel 45 upwardly to rotate about the hinge 46 (which may be formed as bridges, such as of polysilicon, as shown in FIG. 13). The panels 45 that are allowed to rotate up remain in that position until a voltage is applied to the adjacent electrode 50.

The panels 45 may be utilized for various applications. For example, the surfaces of the panels 45 may be coated with a metal to be reflective and act as mirrors such that, when a panel is up, it reflects the light that passes above it when the panel is down. An array of the panels 45 secured to the surface of the substrate 47 may be provided, as shown in FIG. 13, to selectively deflect beams of light between fiber optic cables 54 (e.g., with a light beam 57 provided from laser diode sources and transmitted to detectors by the fiber optic cables 54). Appropriate interconnections can be provided on the substrate 47 to the electrodes 50 to selectively actuate certain of the electrodes, such that when a stress pulse is provided by a piezoelectric transducer 55 to the bottom surface of the substrate 56, it propagates to the top surface 47 to drive up only those panels 45 which are not pulled down by the electrostatic forces on the electrodes 50 beneath them. In this way, a light beam 57 can be selectively switched by erecting selected ones of the panels 45 to direct light from one of the fiber optic cables to another, to form an optical switching network. The micromachined panels 45 and their hinges 46 may be formed using conventional surface micromachining techniques. For example, the panel 45 with an opening in it to define a hinge pin 58 may be deposited on a sacrificial layer on the substrate, followed by appropriate patterning of the sacrificial layer, deposition of the hinge structure 46, and subsequent removal of the sacrificial layers. The panel 45 and the hinges 46 may be formed, for example, of polysilicon. Such structures are conventional and are described in, e.g., Micromachined Transducers Sourcebook, Gregory T. A. Kovacs, 1998, pp. 205–207; and K. S. J. Pister, et al., "Microfabricated Hinges," Sensors and Actuators, Vol. A33, No. 3, June 1992, pp. 249–256. In addition, microparts may be formed such that displacement from the surface without rotation translates such parts to their erected positions.

Although in the foregoing embodiments, the PZT piezoelectric transducer is secured to the bottom surface of the substrate, in accordance with the invention the piezoelectric transducer may be secured to apply pulse stress to the substrate other than at the bottom surface. For example, thin films of PZT or other piezoelectric materials may be integrated with the formation of the micromachined parts on a substrate and be integrated such that they are positioned directly under the surface mounted micropart separated by an intervening layer which effectively acts as a substrate on which the microparts are mounted. Of course, the piezoelectric materials may be integrated with the substrate at the bottom surface and other positions.

Figure 14:
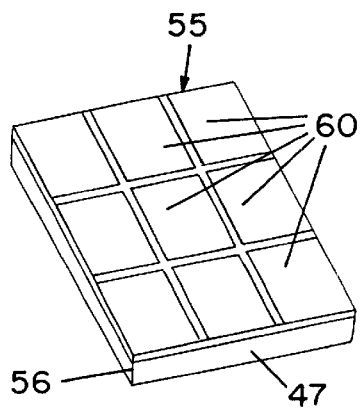
FIG. 14 is a simplified diagram of an array of piezoelectric transducers that may be formed on a substrate for selective actuation of micromechanical parts.

In addition, for various purposes, the piezoelectric transducers can be formed to provide a pattern so as to apply stress pulses to specific areas of the substrate. For example, with reference to FIG. 14, the piezoelectric transducer 55 that activates the array of erectable panels 45 may comprise an array of separate piezoelectric transducers 60, each one of which underlies a specific one of the panels 45. Electrical connectors may then extend to the individual piezoelectric transducer 60 in the array so that pulses of voltage can be applied to only those electrodes in the array which underlie panels 45 which are to be erected.

Figure 15:
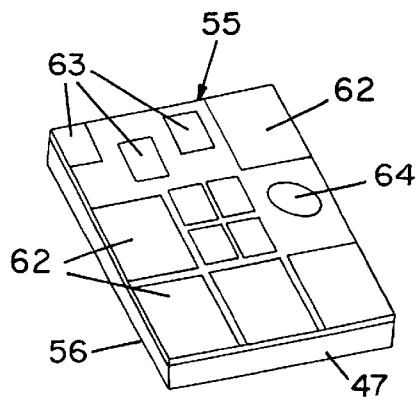
FIG. 15 is a simplified diagram of another example of an array of piezoelectric transducers formed on the bottom side of a substrate for selective actuation of micromechanical parts.

More complicated transducer arrays may be utilized also, if desired, as illustrated in FIG. 15, including large rectangular piezoelectric transducer 62, smaller rectangular piezoelectric transducer 63, and non-rectangular (e.g., circular) transducer 64, which may be selectively supplied with voltage pulses to provide stress pulses having a desired pattern to the substrate to selectively activate devices on the top surface 47 of the substrate 56.

Figure 16:
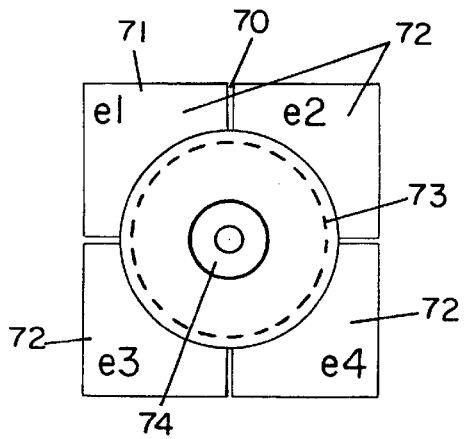
FIG. 16 is an illustrative view of the bottom of a substrate having piezoelectric transducers formed thereon in a pattern that can obtain actuation of a rotor on top of the substrate.

In addition, the various transducers on the substrate can be supplied with voltage pulses having a temporal sequence such that different parts of the micropart on the surface see a stress wave at different times. For example, as illustrated in FIG. 16, a micromechanical structure 70 may have a substrate 71 on one surface of which are formed a set of piezoelectric transducers 72. The transducers 72 may be formed to circle the position of a rotor, and define four separate quadrants. The rotor (illustrated in the dashed lines labeled 73 in FIG. 16) may be mounted on the top surface of the substrate 71 about a hub 74. A stress pulse wave may be repeatedly applied by one or more of the transducers 72 to drive the rotor in rotation about the hub. The four transducers 72 may be fired in a temporal sequence, one after the other, to create a rotating stress wave propagated through the substrate to the top surface which creates a rotating displacement of the top surface, with resulting rotational displacement of the rotor that is in contact with the top surface. By firing each of the four transducers 90° out of phase, the rotor will see a net moment which forces it to turn either clockwise or counterclockwise, depending on the phasing of the firing of the transducers.

Figure 17:
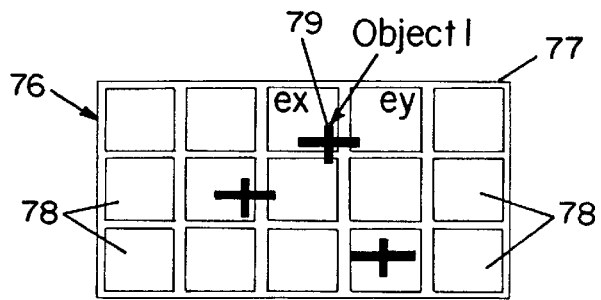
FIG. 17 is a simplified diagram of a substrate having an array of piezoelectric transducers thereon that may be utilized to form a pulse shaker table for microparts on the other surface of the substrate.

As illustrated in FIG. 17, a microelectrical mechanical device 76 may have a substrate 77 on which an array of piezoelectric transducers 78 are formed. An object 79, supported on the opposite surface of the substrate from the surface on which the transducers 78 are mounted, can be moved over the surface of the substrate by appropriate actuation of one after another of the array elements 78. In effect, the substrate can be operated as a pulse shaker table. For example, the Object 1, labeled 79 in FIG. 17, will see more net force from the transducer labeled EX firing than from the firing of the transducer labeled EY, and thus will move toward the position of the transducer EY. By adjusting the amplitude and temporal phasing of the transducers 78, the object (e.g., a free micropart) can be moved to any desired position on the substrate. For example, charge coupled device (CCD)-based optical feedback may be used to automatically control the placement of such an object.

Figure 18:
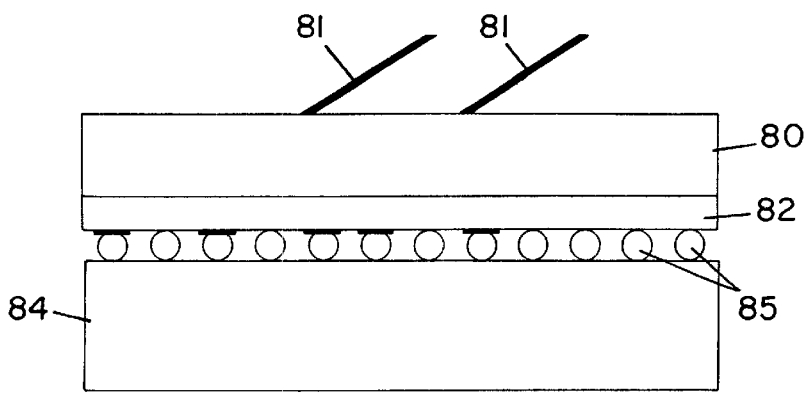
FIG. 18 is a simplified side view of a connection from a power integrated circuit to a piezoelectric transducer array on a substrate for selectively actuating microparts on the surface of the substrate.

The connections to the piezoelectric transducer may be carried out in various desired fashions. One example is illustrated in FIG. 18, in which a substrate 80 carries microparts 81 (e.g., the rotatable panels 45 of FIGS. 11–13), and has a piezoelectric transducer 82 secured to its bottom surface. A CMOS/power integrated circuit 84 may be connected to provide drive power to the piezoelectric transducer 82 through a grid array of contact balls 85 allowing selective connection of power from the integrated circuit driver 84 to the piezoelectric transducer 82 and thus selective application of stress pulses to various positions in the substrate 80.

Further, the pulse stress waves may be applied to the substrate in accordance with the invention to release a formed micropart from a sacrificial layer on the substrate. Rather than using chemical etching to release surface microparts, with appropriate sacrificial layers that are lightly bonded to the formed micropart the stress pulses propagating through the substrate and the sacrificial layer (in appropriate cases, the substrate itself) may be used to delaminate the formed microstructures off of the mechanically weak sacrificial layer.

Figure 19:
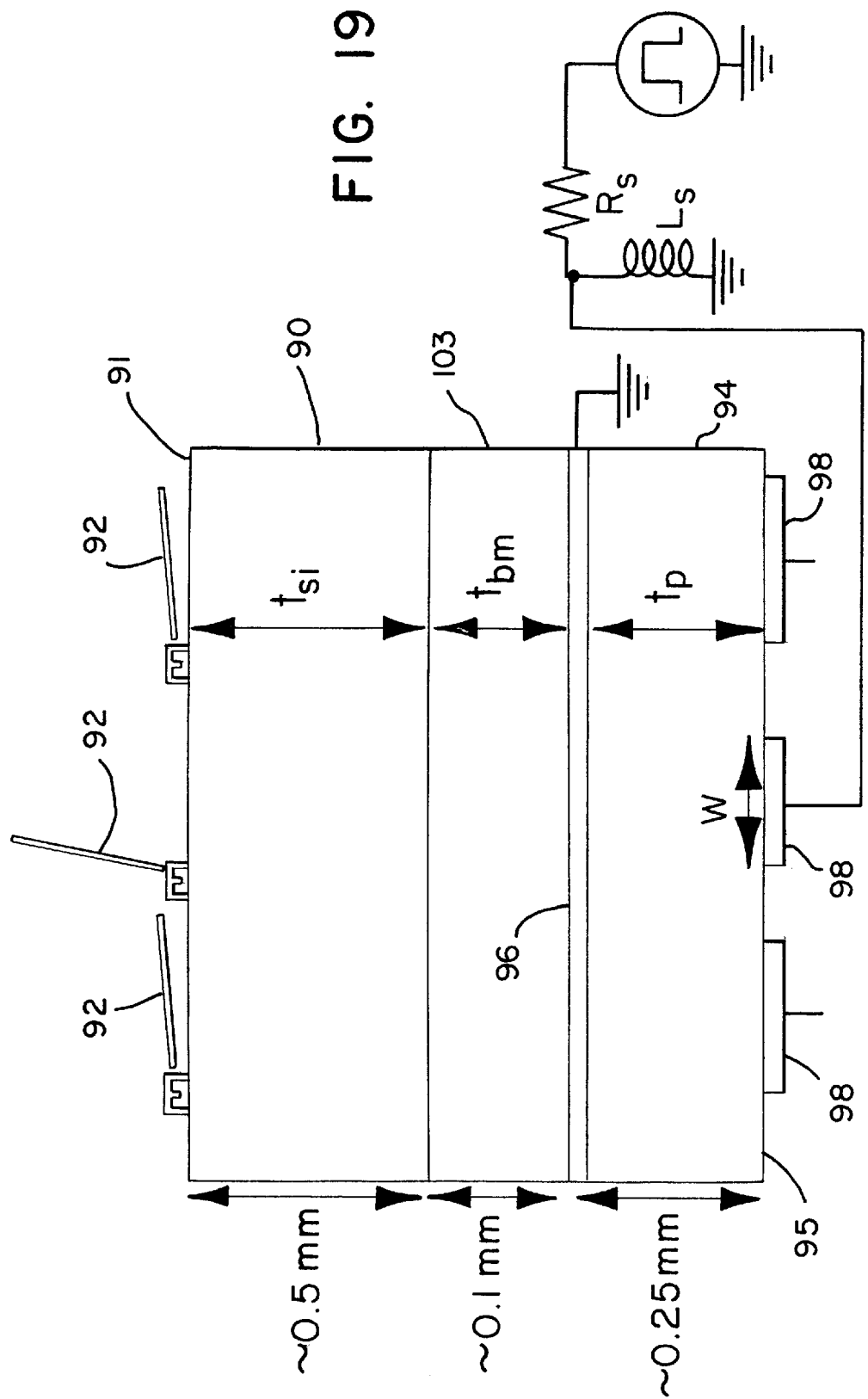
FIG. 19 is an illustrative view of a substrate carrying microparts on its top surface and illustrating the various layers of the structure.
Figure 20:
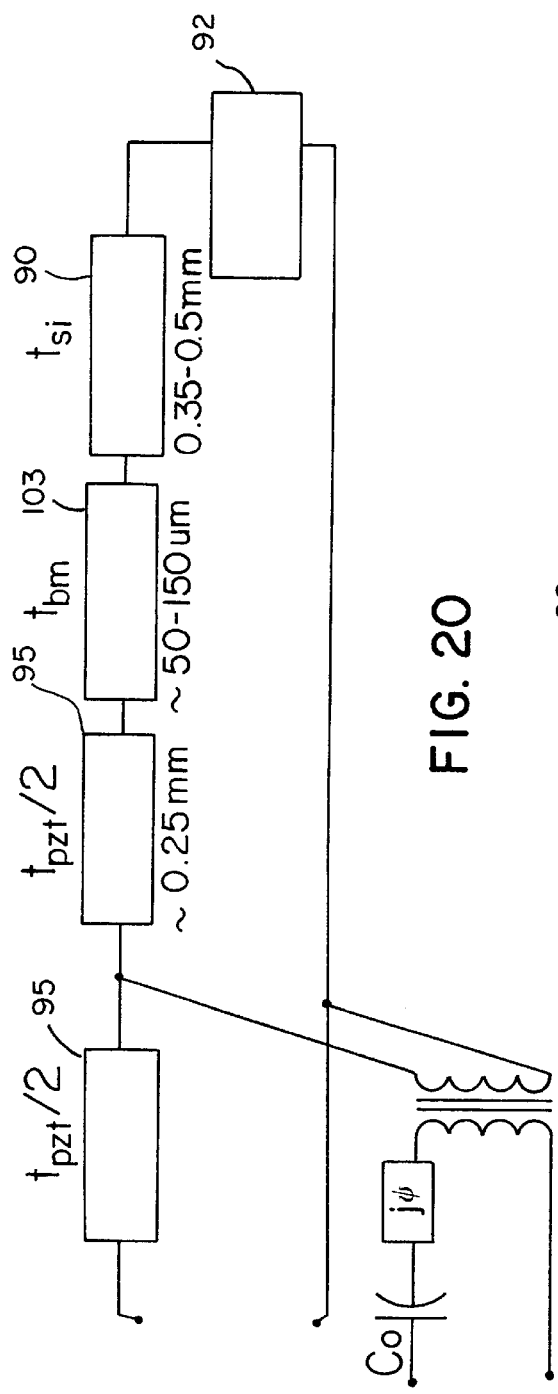
FIG. 20 shows an equivalent waveguide model of the stack structure of FIG. 19.

FIG. 19 shows a cross-sectional view of a micromechanical structure with stress pulse actuation of individual parts thereon. The structure includes a substrate 90 (e.g., crystalline silicon) on a top surface 91 of which are formed an array of erectable panels 92 in the manner as discussed above. Actuation is provided by a piezoelectric transducer 94 comprised of a piezoelectric (e.g., PZT) plate 95 with a single ground electrode 96 on one face of the plate 95 and a series of separate power electrodes 98 on the opposite face of the ceramic plate 95. Each of the power electrodes 98 is supplied with a voltage pulse on a line 100 from a source 101 through appropriate matching impedance elements $R_s$ and $L_s$. It is understood that the power supply 101 may be a separate power supply for each of the electrodes 98 or may be a single power supply which supplies power through a switching network to appropriate ones of the electrodes 98. The piezoelectric transducer 94 is secured to the substrate 90 by an adhesive/matching layer 103. The adhesive layer 103 may be selected to function as a matching layer to enhance pulse coupling to the substrate. Exemplary dimensions for the substrate 90, the piezoelectric ceramic plate 95 and the adhesive matching layer 103 are shown in FIG. 19 for purposes of illustration. An equivalent waveguide model of the structure of FIG. 19 is shown in FIG. 20 and can be used for modeling purposes to optimize the pulse transmission through the multi-layer structure. Table 1 below summarizes the variables in the model as shown in FIG. 20 that affect pulse generation using, as an example, PZT piezoelectric plates.

TABLE 1

Variables that Affect Pulse Generation Using PZT Piezoelectric Plates

| Variable | Effect on Pulse Generation and Performance |
|---|---|
| $w/(t_{si} + t_{bm} + t_{pzt})$ | Pulse spatial distribution, crosstalk, bandwidth, capacitance of individual electrode |
| $t_{si}/t_{pzt}$ | Pulse reflection |
| $t_{pzt}$ | Capacitance of transducer, driver current requirements, voltage required |
| $t_{si}/t_p$ | Pulse propagation time |
| $t_b$ | Pulse absorption, dispersion, matching layer possibility |
| $R_s$, $L_s$ | Matching of source to load |
| $C_0$-capacitance | Affects the current requirement of the driver. For reference: $100 \times 100$ $\mu m^2$ electrode on 0.25 mm thick PZT-4H will be approximately 0.5 pF. |

Figure 21:
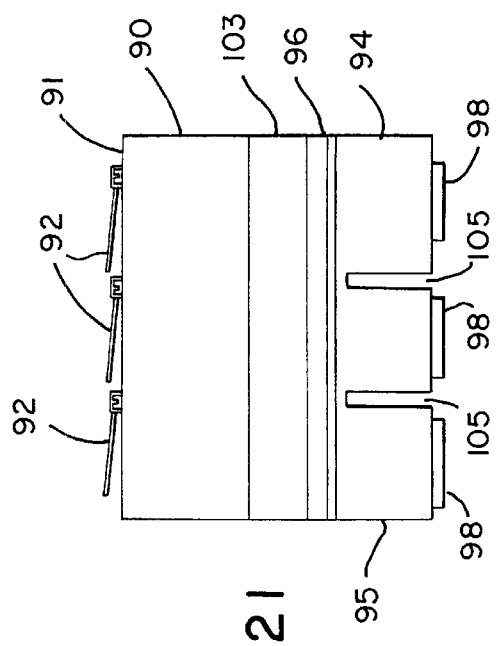
FIG. 21 is an illustrative view of a substrate carrying microparts with a piezoelectric ceramic material having slots formed therein to isolate the drive electrodes.

By using the segmented electrodes 98 (which may be the electrodes illustrated in FIGS. 14–17), stress pulses may be directed to selected parts of the device. However, a stress wave generated in one location on the piezoelectric plate may diffract into surrounding areas, resulting in cross-talk between micromachines. This cross-talk may be substantially reduced by isolating individual PZT sections, e.g., by using high speed dicing saws or laser cutting of the piezoelectric plate, to provide grooves between the PZT sections as illustrated by the grooves 105 in FIG. 21. In general, dimensional control of the PZT-chip and saw blade width, etc., can enable electrode-micromachine alignment tolerances to within 5 microns or less.

Figure 22:
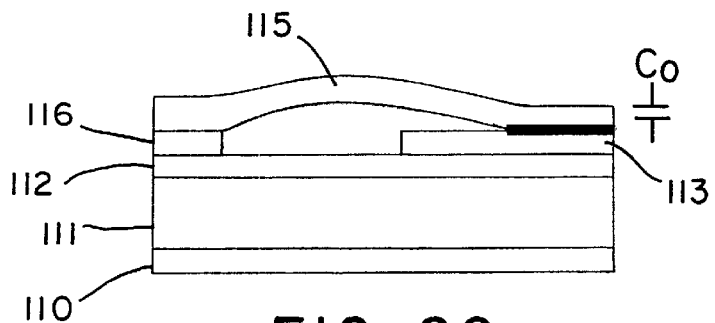
FIG. 22 is an illustrative side view of a substrate which can be utilized to measure the freeing of a micropart from the surface with application of a stress pulse.
Figure 23:
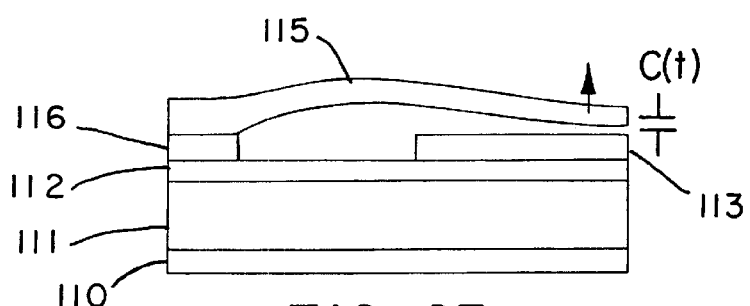
FIG. 23 is a side view of the substrate as in FIG. 22 illustrating the freeing of a microstructure from stiction contact.

One way to measure the dynamics of de-stiction is to use MEMS capacitive sensors. An example of such a sensor is shown in FIG. 22 wherein a piezoelectric plate 110 is bonded to a silicon substrate 111 on which is formed a silicon nitride layer 112. A first layer of polysilicon 113 is formed on the silicon nitride layer 112, and a cantilever layer 115 of polysilicon is formed so that it is attached to the substrate at a base 116 and extends over the polysilicon layer 113. A capacitive sensor is formed between the free layer 115 of polysilicon and the substrate polysilicon layer 113. Similar structures can be formed, for example, between polysilicon and metal-coated nitride beams. The polysilicon beam 115 can be stuck to the surface polysilicon beam 113, as illustrated in FIG. 22, by utilizing liquid capillary forces or by forced electrostatic collapse. Do to native oxide or other residue left from the drying processes, there will be a high capacitance between the two beams. By measuring the capacitance (e.g., using a capacitance bridge), between the fixed beam and the cantilever polysilicon beam during application of pulses from the transducer 110, the capacitance as a function of time can be measured to correlate to the beam movement. The impact-like de-stiction process may result in resonant motion of the beam, which can also be tracked by measuring the capacitance between the free and fixed beams. This method can also be utilized for measuring de-stiction on hinged plates of the type discussed above.

Figure 24:
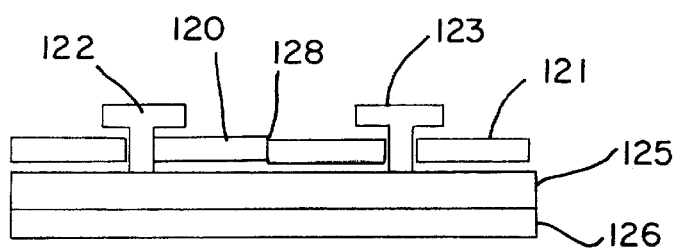
FIG. 24 is an illustrative view of micropart gears formed on a substrate which are stuck together laterally.
Figure 25:
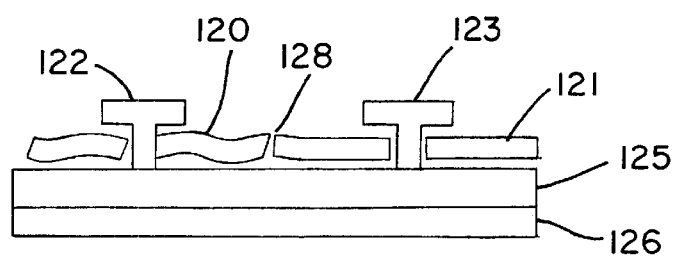
FIG. 25 is a side view of the substrate as in FIG. 24 showing the results of application of a stress pulse to a micropart gear on the substrate.

The present invention may also be utilized to free microparts that are stuck together at lateral edges, as illustrated for exemplification in FIGS. 24 and 25 in which two microgears 120 and 121 are mounted on hubs 122 and 123 that extend from a substrate 125. A piezoelectric transducer 126, e.g., PZT plate, is adhered to the bottom of the substrate 125. The gears 120 and 121 are engaged at their gear toothed surfaces at a position 128 where they may be stuck together by the typical stiction forces. If the gears are initially free to move, and get stuck together later during use, the gears may potentially be either suspended on the hubs 122 and 123 or are stuck together resting on the substrate. If the gears are resting on the hub(s), an ultrasonic pulse applied by the transducer 126 will result in either the gear/hub contact being loosened due to the reflected pulse or the end pulse excitation at the hub will be mode-converted into a flexural plate mode (illustrated in FIG. 25) that would loosen the stiction at the position of gear meshing. If the gears are stuck together while resting on the substrate, the stress pulse will impact the gears to free them by impact forces from the substrate.

It is understood that the invention is not confined to the particular embodiments set forth herein as illustrative, but embraces all such modified forms thereof as come within the scope of the following claims.

What is claimed is:

1. A method of freeing a micromachined micropart a top surface on a substrate to which the micropart is stiction bonded, the substrate for micromachnined microparts having a bottom surface opposite to the top surface, comprising:
    applying an external piezoelectric produced pulsed force to the bottom surface of the substrate to produce a pulse stress wave in the substrate that propagates from the bottom surface to the top surface where it is reflected to generate a spalling action at the top surface to break the bond between the micropart and the surface by spalling action at the top surface as the pulse wave is reflected.

2. The method of claim 1 wherein a piezoelectric transducer is secured to the substrate such that deformations of the piezoelectric transducer are transferred to the substrate, and wherein the step of applying a force to the substrate includes applying an electrical voltage pulse to the piezoelectric transducer to stimulate a pulsed deformation of the transducer and of the substrate to which it is secured to propagate a pulse stress wave through the substrate.

3. The method of claim 2 wherein the piezoelectric transducer comprises a plurality of individually activatable piezoelectric transducers, and including applying voltage pulses to individual transducers to apply a pulse stress wave to the substrate.

4. The method of claim 1 wherein the substrate comprises a semiconductor wafer.

5. The method of claim 1 wherein the micropart is stiction bonded to the surface at a lateral edge of the micropart.

6. The method of claim 5 wherein the micropart is a microgear and the surface to which it is bonded is the gear toothed surface of another microgear, and wherein the microgears are mounted on hubs that extend from the substrate.

7. A method of displacing a micropart that is in contact with but not bonded to a substrate top surface, the substrate having a bottom surface opposite to the top surface, comprising:

applying an external pulsed force to the substrate to produce a pulse stress wave in the substrate that propagates from the bottom surface to the top surface where it is reflected with a rapid displacement of the top surface toward and then away from the micropart to transfer energy from the reflected pulse stress wave to the micropart and to displace the micropart away from the surface by impact energy transferred from the reflected stress wave.

8. The method of claim 7 wherein a piezoelectric transducer is secured to the substrate such that deformations of the piezoelectric transducer are transferred to the substrate, and wherein the step of applying a force to the substrate includes applying an electrical voltage pulse to the piezoelectric transducer to stimulate a pulsed deformation of the transducer and of the substrate to which it is secured to propagate a pulse stress wave through the substrate.

9. The method of claim 8 wherein a piezoelectric transducer is secured to the substrate such that deformations of the piezoelectric transducer are transferred to the substrate, and wherein the step of applying a force to the substrate includes applying an electrical voltage pulse to the piezoelectric transducer to stimulate a pulsed deformation of the transducer and of the substrate to which it is secured to propagate a pulse stress wave through the substrate.

10. The method of claim 7 wherein the substrate comprises a semiconductor wafer.

11. The method of claim 7 wherein the micropart is a rotor mounted to a hub extending from the top surface, and wherein the step of applying a pulse stress wave is repeated to drive the rotor in rotation about the hub.

12. A micromechanical structure comprising:
(a) a substrate with a top surface and an opposite bottom surface;
(b) a micropart in contact with the substrate top surface; and
(c) a piezoelectric transducer secured to the substrate such that deformations of the piezoelectric transducer are transferred to the substrate, the piezoelectric transducer deforming in response to drive voltage applied to the piezoelectric transducer; and
(d) a pulse power supply electrically connected to the piezoelectric transducer, the pulse power supply selectively providing a pulse of voltage to the piezoelectric transducer of a selected voltage level and pulse width such that the piezoelectric transducer applies a pulsed force to the bottom surface of the substrate.

13. The micromechanical structure of claim 12 wherein the substrate comprises a semiconductor wafer.

14. The micromechanical structure of claim 12 wherein the semiconductor wafer is single crystal silicon and the micropart in contact with the top of the surface of the substrate is formed of polysilicon.

15. The micromechanical structure of claim 12 wherein the piezoelectric transducer is secured to the bottom surface of the substrate with adhesive.

16. The micromechanical structure of claim 15 wherein the adhesive is formed in a layer selected to provide a matching layer to enhance coupling of stress pulses from the piezoelectric transducer to the substrate.

17. The micromechanical structure of claim 12 wherein the piezoelectric transducer is secured to the substrate by being formed integrally in contact with the substrate.

18. The micromechanical structure of claim 12 including a mounting jig, and wherein the piezoelectric transducer is secured to the bottom substrate surface by mechanical pressure applied between the substrate and the piezoelectric transducer by the jig.

19. The micromechanical structure of claim 12 wherein the micropart comprises a micromachined panel in contact with the substrate top surface and a hinge secured to the substrate top surface and connected to the panel such that the panel can rotate about the hinge.

20. The micromechanical structure of claim 19 wherein there are a plurality of panels in an array in contact with the top surface of the substrate, and a plurality of hinges secured to the top surface and each connected to a one of the panels such that each panel is connected to a hinge for rotation about the hinge.

21. The micromechanical structure of claim 12 wherein the piezoelectric transducer comprises a plurality of individually activatable piezoelectric transducers.

22. The micromechanical structure of claim 21 wherein the plurality of piezoelectric transducers is formed in a rectangular array.

23. The micromechanical structure of claim 21 wherein the piezoelectric transducer comprises a plate of piezoelectric material with a ground electrode on one surface and a plurality of separate electrodes on an opposite surface, and including grooves in the piezoelectric plate between the separate electrodes to isolate the electrodes.

24. A method of actuating microparts comprising:
(a) providing a substrate with a top surface, at least one micromachined panel in contact with the top surface, and a hinge secured to the top surface and connected to the panel such that the panel can rotate about the hinge; and
(b) applying a pulse stress wave to the substrate that propagates through the substrate and is reflected at the top surface to transfer energy from the reflected pulse stress wave to the panel to displace the panel away from the surface and rotate it about the hinge.

25. The method of claim 24 wherein the step of applying a pulse stress wave to the substrate comprises applying a force to a surface of the substrate opposite to the top surface to propagate a pulse stress wave through the substrate to the top surface.

26. The method of claim 25 wherein a piezoelectric transducer is secured to the substrate such that deformations of the piezoelectric transducer are transferred to the substrate, and wherein the step of applying a force to the substrate includes applying an electrical voltage pulse to the piezoelectric transducer to stimulate a pulsed deformation of the transducer and of the substrate to which it is secured to propagate a pulse stress wave through the substrate.

27. The method of claim 24 wherein the substrate has a bottom surface opposite to the top surface, and wherein the step of applying a pulse stress wave to the substrate includes applying a pulsed force to the bottom surface of the substrate to produce a compressive stress wave in the substrate that propagates from the bottom surface to the top surface where it is reflected to displace the panel.

28. The method of claim 27 wherein the substrate comprises a semiconductor wafer.

* * * * *

UNITED STATES PATENT AND TRADEMARK OFFICE
CERTIFICATE OF CORRECTION

PATENT NO.    : 6,433,463 B1
DATED         : August 13, 2002
INVENTOR(S)   : Amit Lal et al.

It is certified that error appears in the above-identified patent and that said Letters Patent is hereby corrected as shown below:

Column 1,
Line 57, please delete "Transducers 1997" and replace with -- Transducers '97 --.

Column 3,
Line 36, please delete the words "Fig. 9 graph showing" and replace with
-- Fig. 9 are graphs showing --.

Column 6,
Line 33, please delete "$\in_{PZT}$" and replace with -- $\varepsilon_{PZT}$ --.
Line 64, please delete the word "kilopascals" and replace with -- kiloPascals --.

Column 12,
Line 32, insert the word -- from -- between the words "micropart a" to appear
as -- micropart from a --.

Signed and Sealed this

Fourth Day of March, 2003

JAMES E. ROGAN
*Director of the United States Patent and Trademark Office*